United States Patent
Miyamoto

[11] Patent Number: 5,570,382
[45] Date of Patent: Oct. 29, 1996

[54] CLOCK SIGNAL FAULT DETECTOR

[75] Inventor: Katsuhiko Miyamoto, Tokyo, Japan

[73] Assignee: Oki Electric Industry Co., Ltd., Tokyo, Japan

[21] Appl. No.: 494,932

[22] Filed: Jun. 26, 1995

[30] Foreign Application Priority Data

Jul. 6, 1994 [JP] Japan ..................... 6-177442

[51] Int. Cl.⁶ ............... G11B 27/00; H03M 13/00; H04L 1/00
[52] U.S. Cl. ............... 371/61; 371/57.1; 371/65; 371/57.2
[58] Field of Search .................. 371/61, 62, 57.1, 371/57.2, 48, 65, 60; 395/550, 185.01, 185.08; 327/18, 20, 21, 47, 48; 360/38.1; 324/532, 535, 555, 73.1

[56] References Cited

U.S. PATENT DOCUMENTS

| | | | |
|---|---|---|---|
| 4,144,448 | 3/1979 | Pisciotta et al. | 110/123 |
| 4,542,509 | 9/1985 | Buchanan et al. | 371/61 |
| 4,973,962 | 11/1990 | Shimizu | 341/166 |
| 5,410,557 | 4/1995 | Scholz | 371/37.2 |
| 5,479,420 | 12/1995 | Hong et al. | 371/61 |

*Primary Examiner*—Robert W. Beausoliel, Jr.
*Assistant Examiner*—Phung My Chung
*Attorney, Agent, or Firm*—Law Office of Steven M. Rabin, P.C.

[57] ABSTRACT

A clock signal hull detector includes a signal level monitor for detecting an extraordinary condition in which the clock signal to be monitored is stuck at either a high level or a low level and a turning point number monitor for detecting an extraordinary condition in which the clock signal changes its level between the high and low levels with high frequency. The outputs of the signal level monitor and the turning point number monitor are fed to a fault judgment portion, which delivers an output according to the extraordinary conditions. The output of the fault judgment portion is then fed to a counting portion at which a fault judgment signal is fed to its output when its input signal is counted to a predetermined value or above.

10 Claims, 5 Drawing Sheets

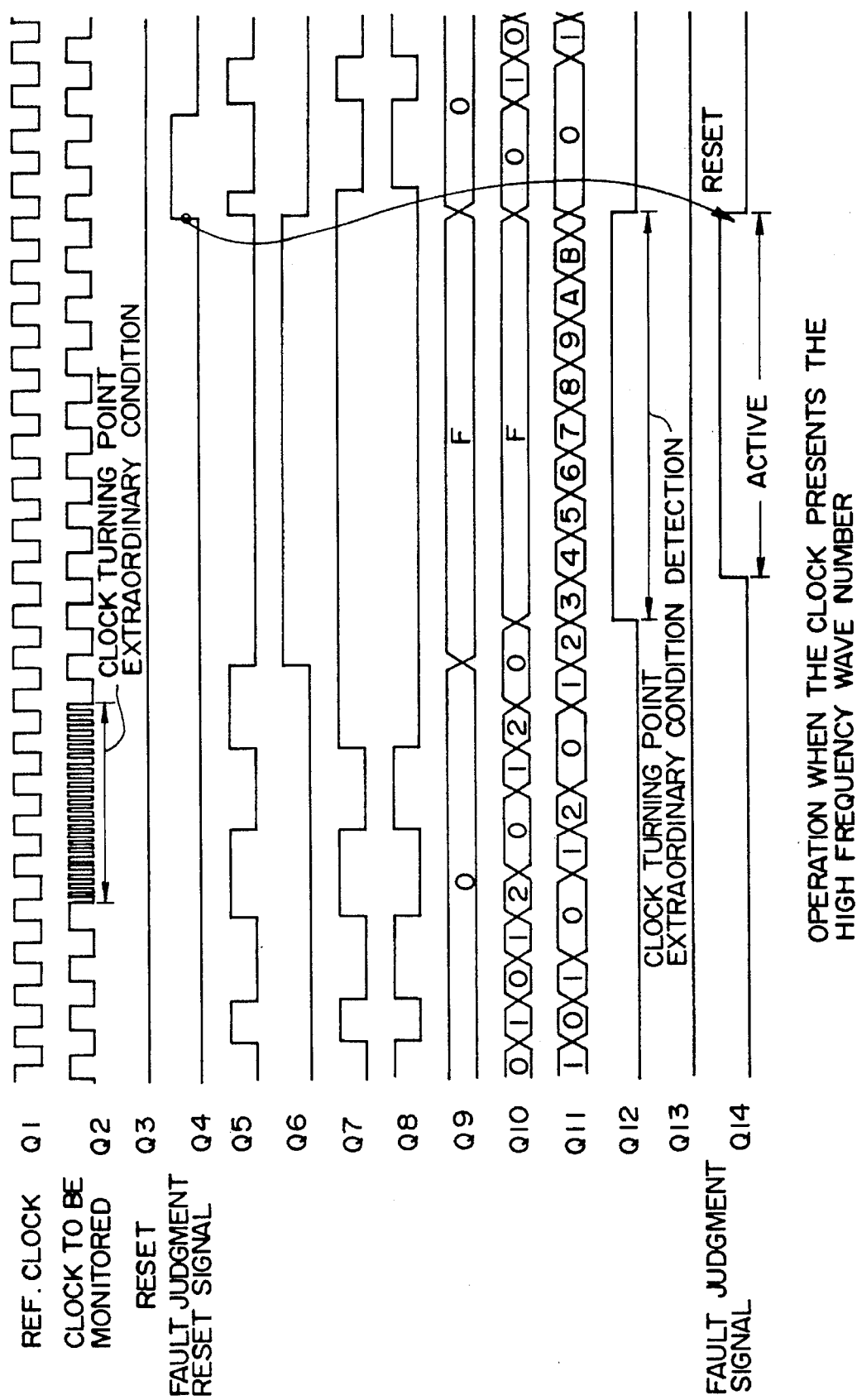

CLOCK SIGNAL FAULT DETECTOR

REFERENCE TO THE RELATED APPLICATION

This application claims the priority right of Japanese Patent Application No. Hei 06-177442 filed on Jul. 6, 1994, the entire disclosure of which is incorporated herein by reference.

BACKGROUND OF THE INVENTION

1. Field of the Invention

This invention relates to a clock signal fault detector for detecting extraordinary conditions of a clock signal used in respective controllers in a computer or the like.

2. Description of Related Art A known clock signal fault detector has a monostable multivibrator connected with a CR filter and detects whether a clock signal changes in a predetermined period determined by the time constant of the CR filter. The clock fault detector thereby judges that the clock signal is in the ordinary condition when one or more level changes of the clock signal have been detected within the predetermined period, and, determines that the clock signal is in an extraordinary condition when no level change of the clock signal has been detected within the predetermined period. The clock signal fault detector can therefore detect extraordinary conditions such that the clock signal is fixed, or stuck, at either a high level or a low level.

However, such a conventional technique as described above has raised the following problems. Where the clock signal is in the ordinary condition and repeats high and low levels alternately with a constant period, the clock signal is, with the conventional technique, assumed to be in the ordinary condition if at least one level change of the clock signal has been detected within the certain period of time. Accordingly, such a conventional technique could not distinguish a clock signal fault in which the clock signal changes between high and low levels with an extraordinarily high frequency, relative to the normal condition. Thus, the conventional technique could not detect this situation as an extraordinary condition.

With the conventional technique, the period of time to be monitored is determined by a time constant given by the capacitor and a resistor. Therefore, the monitoring period could not be set to a short time basis, such as a nanosecond basis, suitable for current clock precision. Since the conventional technique uses a clock signal fault detector, constituted of analog elements such as capacitors and resistors, the clock signal fault detector could not easily be incorporated into an LSI device.

SUMMARY OF THE INVENTION

It is an object of the present invention to provide a clock signal fault detector capable of detecting even a fault in which the clock shifts with high frequency between high and low levels.

It is another object of the present invention to provide a clock signal fault detector capable of detecting a fault during a short monitoring period such as on a nanosecond basis.

It is a further object of the present invention to provide a clock signal fault detector capable of being built in an LSI device.

The foregoing objects are accomplished with a clock signal fault detector including a signal level monitor for monitoring a clock signal to be monitored, in synchronicity with a reference clock signal, to detect when the clock signal's level regains unchanged for a certain period, a turning point number monitor for monitoring the number of turning points of the clock signal to detect a fault when the number is greater than or equal to a certain number, a fault judgment portion for feeding an output signal, corresponding to faults detected by the monitors at its output; and a counting portion for delivering a fault judgment signal upon a judgment made when the duration of the output signal is equal to or greater than a predetermined period. When the clock signal is stuck at either a high level or a low level, the signal level monitor provides a signal indicative of a fault to the fault judgment portion. When the clock signal changes its level with high frequency, the turning point number monitor provides a signal indicative of a fault to the fault judgment portion. The counting portion receives the output signal of the fault judgment portion, which output signal is either indicative of the period for which the level of the clock signal is unchanged when the signal level monitor operates or is indicative of a fully counted value of the counter when the turning point number monitor operates. The counting portion delivers the fault judgment signal as the output of the clock signal fault detector.

BRIEF DESCRIPTION OF THE DRAWINGS

The above and other objects and features of the present invention are apparent to those skilled in the art from the following preferred embodiments thereof when considered in conjunction with the accompanied drawings, in which:

FIG. 5 is a time chart showing the operation of the detector shown in FIG. 1 when a clock signal to be monitored presents a high frequency wave number.

DETAILED DESCRIPTION OF THE PREFERRED EMBODIMENTS

Figure 1:
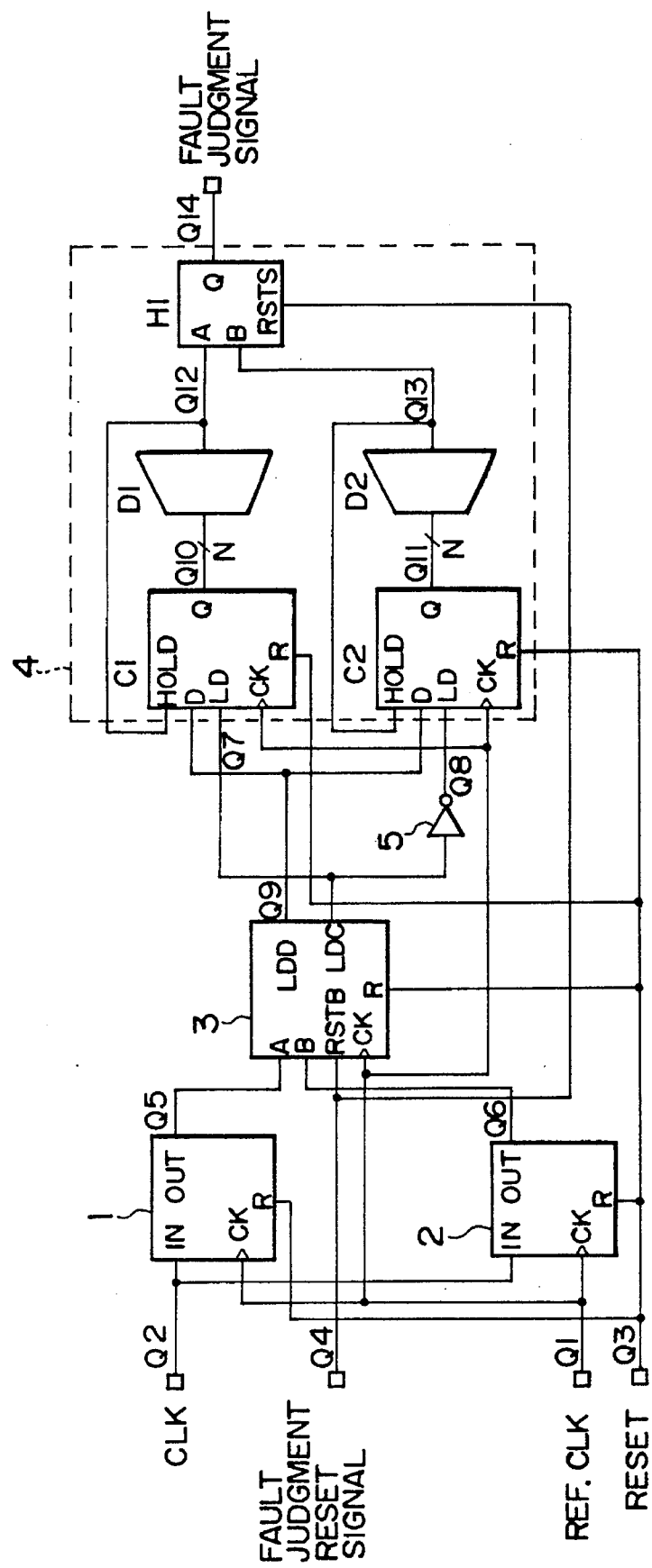
FIG. 1 is a block diagram illustrating a clock signal fault detector according to a preferred embodiment of the invention.
Figure 2:
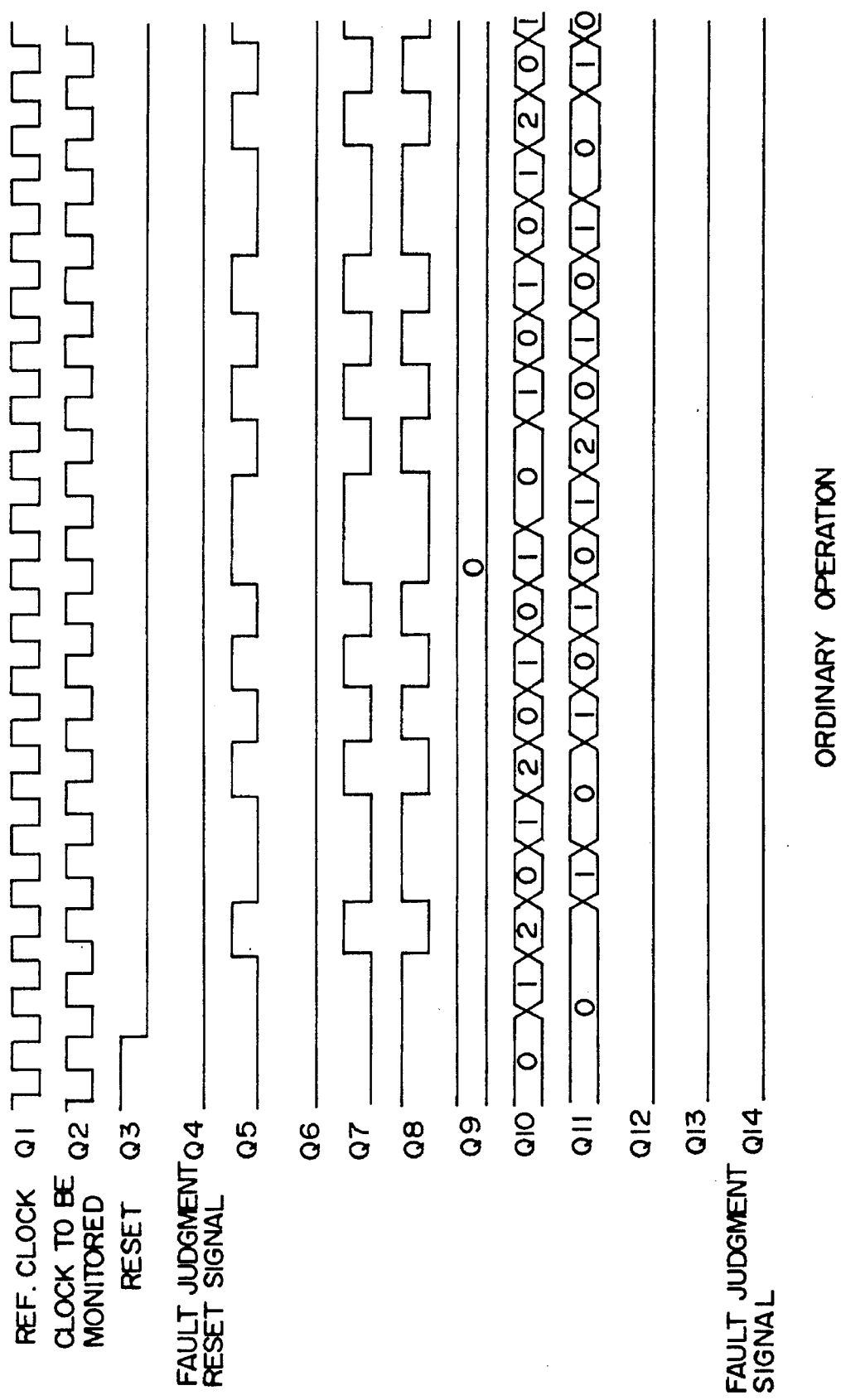
FIG. 2 is a time chart showing the operation of the detector shown in FIG. 1, when the clock signal is normal.

Referring to the drawings in detail, in particular, to FIG. 1, a clock signal fault detector according to a preferred embodiment of the invention is shown. The clock signal fault detector is essentially constituted of a signal level monitor 1, a turning point number monitor 2, a fault judgment portion 3, and a counting portion 4. The signal level monitor 1, the turning point number monitor 2, the fault judgment portion 3, and the counting portion 4 are all built on a substrate used for an LSI device, together with other circuits functioning according to the purpose of the LSI device. The LSI device preferably has entirely digital circuitry.

The signal level monitor 1 monitors time for which the clock signal to be monitored is stuck at either a high level or a low level. That is, the signal level monitor 1 delivers the clock signal Q2 to be monitored, in synchronicity with a reference clock signal Q1 for detecting extraordinary conditions, and delivers an output signal Q5 stuck at either the high level or the low level when the clock signal Q2 to be monitored is stuck at either the high level or the low level.

The turning point number monitor 2 delivers an extraordinary turning point detection signal Q6, which is at the high level (active) when the number of turning points between the high and low levels of the clock signal Q2 to be monitored is equal to or greater than a predetermined number within a certain period of time, and which is otherwise at the low level. The turning point number monitor 2 has circuitry not shown, but composed of one or more of counter circuits, differential circuits, comparator circuits and whatever. The differential circuits or the like detect turning points of leading or tailing edges of the clock signal Q2 to be monitored; the internal counter circuits count the number of the turning points detected within a predetermined period defined by the reference clock signal Q1. The comparator circuits compare the counted number with a predetermined number as to whether the counted value is equal to or greater than the predetermined value. If the counted number is equal to or greater than the predetermined value, the extraordinary turning point detection signal Q6 is made high at the output of the turning point number monitor 2.

The fault judgment portion 3 is constituted of an OR circuit, register circuits storing predetermined data, and whatever. The fault judgment portion 3 receives the respective output signals from the signal level monitor 1 and the turning point number monitor 2 as inputs A and B, respectively. The signal level monitor 1 and the turning point number monitor 2 do not feed their output signals at the same time; only one signal from either of monitors 1, 2 is fed to the fault judgment portion 3. The output signal from either of the signal level monitor 1 and the turning point number monitor 2 is delivered from fault judgement portion 3 to a counter C1 of the counting portion 4 as a load signal Q7. The output signal is also fed as a load signal Q8 to a counter C2 of the counting portion 4, through an inverter 5.

The counting portion 4 is constituted of the counters C1, C2, decoders D1, D2 and a holding circuit H1. The counter C1 fetches load data Q9 upon receiving the load signal Q7 and counts the number of cycles of the reference clock signal Q1. For example, if the load data Q9 is "0," the counter C1 begins the count from "0". The counter C1 stops its counting upon receiving a holding signal and holds the counted value at that time. The counter C2 fetches the load data Q9 upon receiving the load signal Q8 that is made with inverting the load signal Q7 by the inverter 5, and counts the number every period of the reference clock signal Q1. Similarly to the counter C1, for example, if the load data Q9 is "0", the counter C2 begins the count from "0". The counter C2 stops its counting upon receiving the holding signal and holds the counted value at that time.

These counters C1, C2 are connected to the decoders D1, D2, respectively. Upon receiving a predetermined value "X", the decoders D1, D2 feed the decoded value at their outputs and return the holding signal to the counters C1, C2. The decoded value "X" of the decoders D1, D2 is held at the holding circuit H1, which feeds the decoded value as a fault judgment signal Q14.

In FIG. 1, the reference clock signal Q1 and a reset signal Q3 that are fed from respective terminals are supplied to the clock and reset terminals of the signal level monitor 1, the turning point number monitor 2, the fault judgment portion 3, and the counters C1, C2. Upon input of the fault judgment reset signal Q4 to the fault judgment portion 3, the fault judgment portion 3 is compelled to feeds the load data "0" to the counting portion 4.

In operation, in accordance with the reference clock signal Q1 for detecting extraordinary conditions, the signal level monitor 1 monitors periods for which the clock signal Q2 is held at either the high level or the low level. The longer the period for which the clock signal is at either the high level or the low level, the longer the period for which the detected signal is at either the high level or the low level. The turning point monitor 2 monitors the number of turning points of the clock signal Q2 within the predetermined period of time, and delivers the extraordinary turning point detection signal Q6 upon detecting a number of turning points equal to or greater than the predetermined number.

Since the reference clock signal Q1 for detecting extraordinary conditions is asynchronous with the clock signal Q2, the condition (effective period) of the output signals of the signal level monitor 1 and the turning point number monitor 2 may deviate more or less even where the clock signal Q2 is normal.

In the fault judgment portion 3, when the extraordinary turning point detection signal Q6 is inactive, the output of the signal level monitor 1 is fed to the counter C1 as the load signal for the counter, and its inverted signal is fed to the counter C2. The load data of the counter C1 is set at "0". At that time, in the counters C1, C2, when one counter is operating, the other counter is being reset.

When the condition of the clock signal Q2 is ordinary (not extraordinary) condition, after the counter C1 counts the number about once or twice, the counter C1 is reset upon the output of the load data "0" from the fault judgment portion 3 and returns its counted value to "0".

Figure 3:
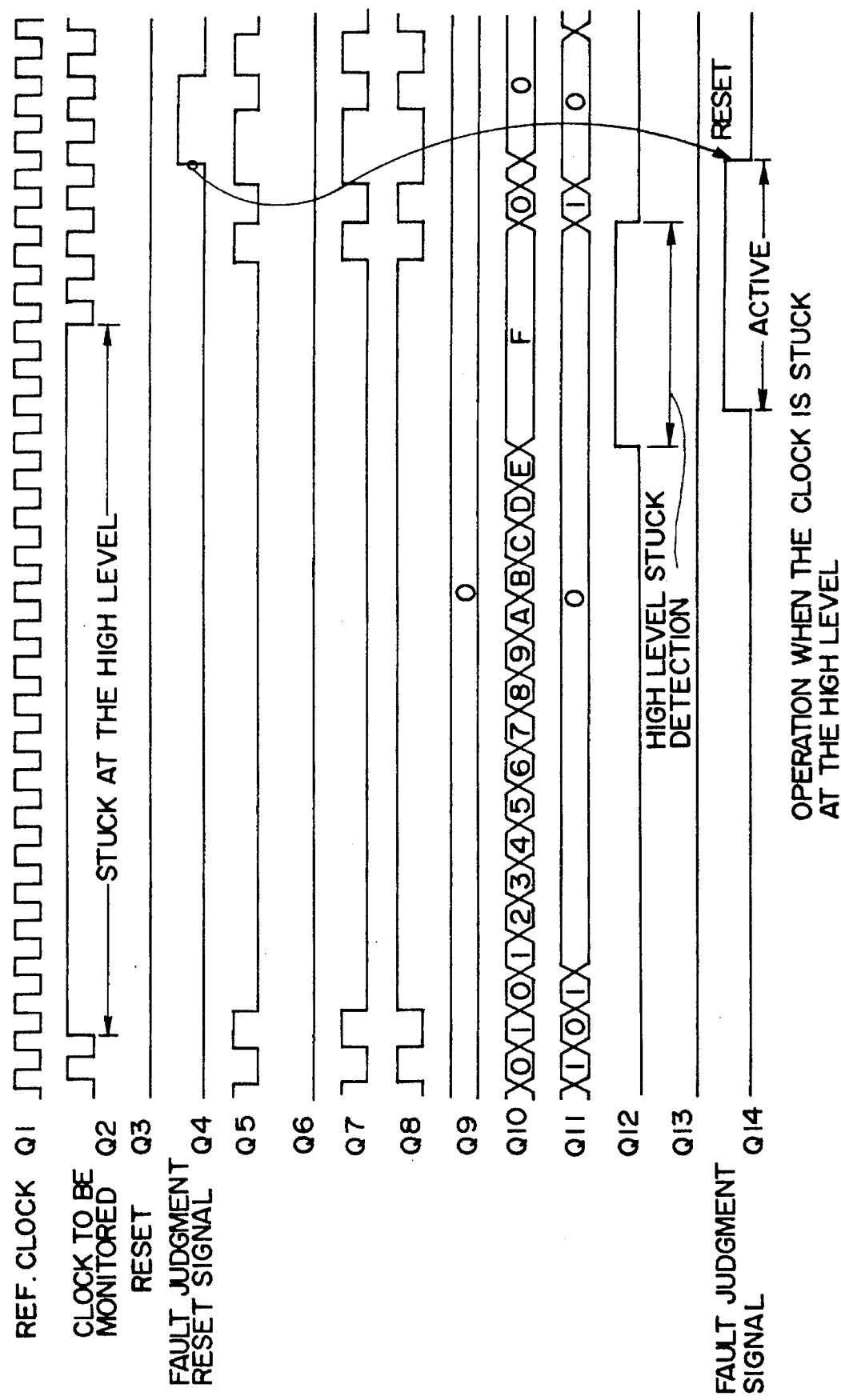
FIG. 3 is a time chart showing the operation of the detector shown in FIG. 1 when a clock signal to be monitored is stuck at a high level.

However, when as shown in FIG. 3 the clock signal Q2 is stuck at the high level and stops its level shift, the counter C1 counts its duration. When the counted duration becomes equal to the decoded value "X", the holding signal Q12 is transmitted from the decoder D1 to the counter C1 to cause the counter C1 to hold at "X (=F)". The holding signal Q12 is also fed to the holding circuit H1 as the detected signal when the clock signal Q2 is stuck, to. The holding circuit H1 feeds the signal Q12 as the fault judgment signal Q14. As described above, this clock signal fault detector makes the fault judgment signal Q14 active when the clock signal Q2 to be monitored continues to be at the high level for a period equal to or more than the period from the 1st cycle to the Fth cycle of the reference clock signal Q1.

Figure 4:
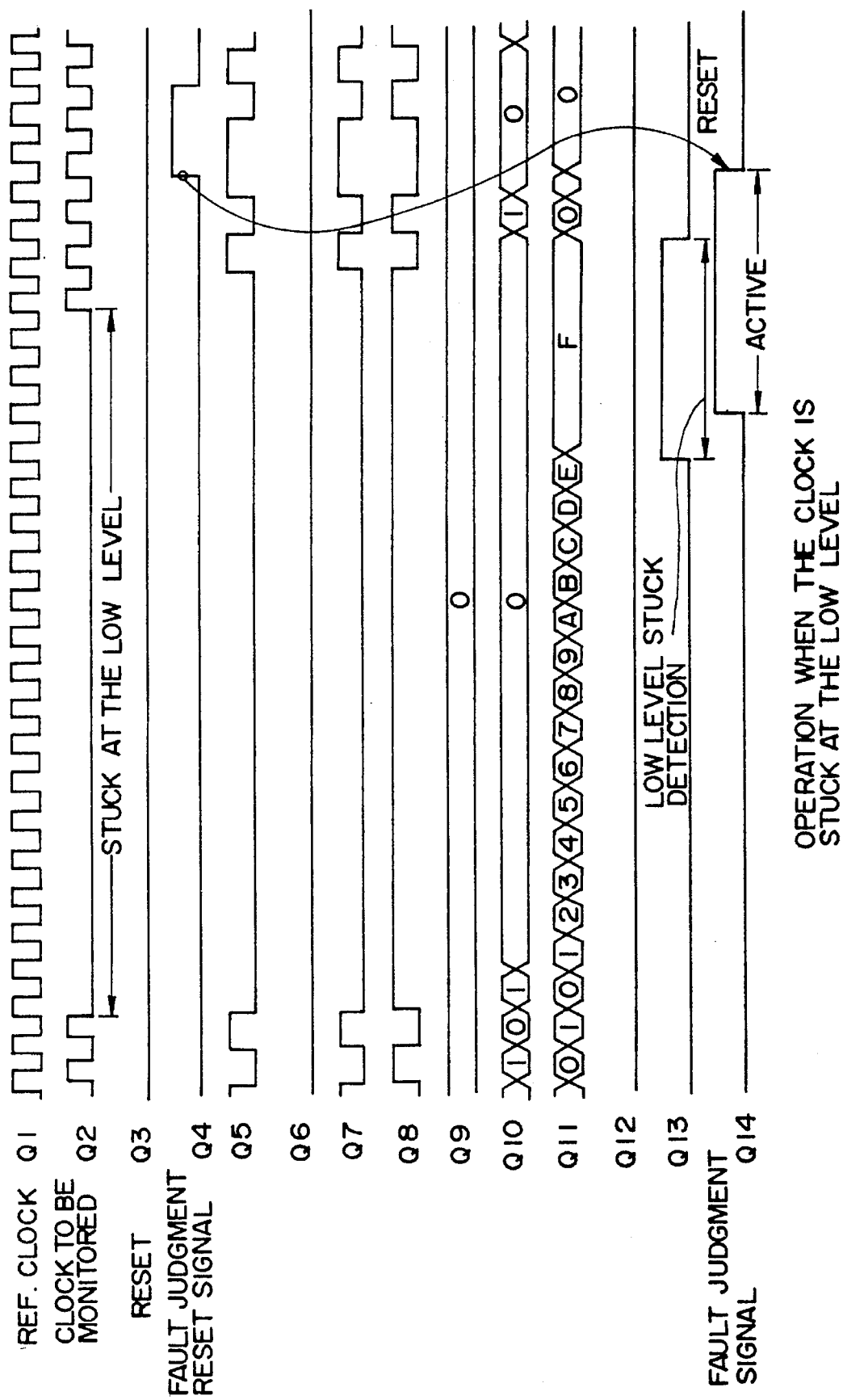
FIG. 4 is a time chart showing the operation of the detector shown in FIG. 1 when a clock signal to be monitored is stuck at a low level.

In contrast, when as shown in FIG. 4 the clock signal Q2 is stuck at the low level and stops its level shifting, the counter C2 counts its duration. When the counted duration becomes equal to the decoded value "X", the holding signal Q13 is transmitted from the decoder D2 to the counter C2 so that the counter C2 is held at "X (=F)". The holding signal Q13 is also fed as the detected signal, to the holding circuit H1 when the clock signal Q2 is stuck. The holding circuit H1 feeds the signal Q13 as the fault judgment signal Q14. This clock signal fault detector also makes the fault judgment signal Q14 active when the clock signal Q2 to be monitored continues to be at the low level for a period equal to or more than the period from the 1st cycle to the Fth cycle of the reference clock signal Q1.

As shown in FIG. 5, in the fault judgment portion 3, when the turning points of the clock signal Q2 present an extraordinary condition (extraordinarily high frequency condition), the output of the turning point number monitor 2 is fed, as the load signal for the counter C1, to the counter C1, and its inverted signal is fed to the counter C2. When the clock signal Q2 presents such an extraordinarily high frequency condition, the load data of the counter C1 is set at "F". The fault judgment signal Q14 is delivered immediately after the data "F" is given to the counter C1. On the other hand, the counter C2 is not set at "F" because of operation of the inverter 5, and enters into a holding condition after counting its value up to "F".

When the fault judgment reset signal Q4, which is supplied from outside of the detector, is fed to the fault judgment portion 3 and the holding circuit H 1, the fault judgment signal Q14 is inverted to the low level so as to be inactive. The output of the fault judgment portion 3 is thereby stopped; the counters C1, C2 are set at the data "0"; and the holding circuit H1 is also initialized.

The clock signal fault detector thus constituted uses the reference clock separately for detection in order to provide clock monitoring, so that this detector can detect extraordinary conditions of the clock signal where the faults, in lines of the clock signal that is received from a transmission line for a digital communication LSI device are detected using the internal clock signal of another LSI device. Thus, the clock signal fault detector is composed only of digital circuits and is easily formed inside of the LSI device, thereby enabling the number of parts that are to be mounted on the substrate to be reduced. The clock signal fault detector shown in FIG. 1 can strictly monitor the clock signal Q2 on a nanosecond basis by setting the reference clock signal Q1 on a nanosecond basis, and can flexibly alter its monitoring period.

As described above, the clock signal fault detector according to this invention is constituted of digital circuits operated by the reference signal for detecting extraordinary conditions, so that the detector can detect even faults of the clock signals such that the turning frequency between the high level and the low level is extraordinarily high. The monitoring period of the detector is determined by the reference clock signal for detecting an extraordinary condition, so that the detector can set a short period such as on a nanosecond basis. Furthermore, the detector is to be constituted of digital circuits, so that the detector can be easily built in an LSI device.

It is understood that although the present invention has been described in detail with respect to preferred embodiments thereof, various other embodiments and variations are possible to those skilled in the art which fall within the scope and spirit of the invention, and such other embodiments and variations are intended to be covered by the following claims.

What is claimed is:

1. A clock signal fault detector comprising:
   a signal level monitor for monitoring a clock signal to be monitored, in synchronicity with a reference clock signal to detect extraordinary conditions, and for determining the existence of a clock fault of a first kind when the level of the clock signal to be monitored is in an unchanged condition for a first predetermined period or longer;
   a turning point number monitor for monitoring the number of turning points of the clock signal to be monitored when the level of the clock signal to be monitored changes during a second predetermined period and for determining the existence of a clock fault of a second kind when the number of the turning points in the second predetermined period is equal to or greater than a predetermined number;
   a fault judgment portion having an output, for detecting kinds of clock faults determined by the signal level monitor and by the turning point number monitor, and for feeding an output signal corresponding to the detected kind of clock faults at the output; and
   a counting portion for counting the duration of the output signal of the fault judgment portion and for delivering a fault judgment signal when the duration of the output signal is equal to or greater than a predetermined duration.

2. The clock signal fault detector according to claim 1, wherein the counting portion includes a first counter that counts a first length of a period for which the clock signal to be monitored is stuck at a high level and a second counter that counts a second length of a period for which the clock signal to be monitored is stuck at a low level.

3. The clock signal fault detector according to claim 2, wherein the counting portion further includes a first decoder connected to the first counter, for receiving the first length counted by the first counter and delivering a holding signal while the counted first length has a first predetermined value and above, a second decoder connected to the second counter, for receiving the second length counted by the second counter and delivering a holding signal when the counted second length has a second predetermined value and above, and a holding circuit that receives the holding signal from the decoders and delivers the output signal of the counting portion.

4. The clock signal fault detector according to claim 3, wherein the holding signals delivered by the first and second decoders are returned to the first and second counters, respectively, to latch up outputs of the first and second counters.

5. The clock signal fault detector according to claim 2, further comprising an inverter, wherein the output signal of the fault judgment portion is fed to the first counter, and is fed to the second counter through the inverter.

6. The clock signal fault detector according to claim 2, wherein the first and second counters receive the output signal of the fault judgment portion either indicative of the period for which the level of the clock signal is unchanged, when the signal level monitor operates, or indicative of a counted number of turning points equal to or greater than the predetermined number, when the turning point number monitor operates.

7. The clock signal fault detector according to claim 1, wherein the clock signal to be monitored is not synchronous with the reference signal.

8. The clock signal fault detector according to claim 1, wherein the predetermined duration is equal to the duration of a number of cycles of the reference signal.

9. The clock signal fault detector according to claim 1, wherein the signal level monitor, the turning point number monitor, the fault judgment portion, and the counting portion 811 are built on a substrate used for an LSI device.

10. The clock signal fault detector according to claim 9, wherein the LSI device has entirely digital circuitry.

\* \* \* \* \*